(12) United States Patent
Sexton et al.

(10) Patent No.: US 8,940,098 B2
(45) Date of Patent: Jan. 27, 2015

(54) METHOD FOR DISTRIBUTING GAS FOR A BEVEL ETCHER

(71) Applicant: Lam Research Corporation, Fremont, CA (US)

(72) Inventors: Greg Sexton, Fremont, CA (US); Andrew D. Bailey, III, Pleasanton, CA (US); Alan Schoepp, Ben Lomond, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/933,515

(22) Filed: Jul. 2, 2013

(65) Prior Publication Data

US 2013/0276821 A1  Oct. 24, 2013

Related U.S. Application Data

(60) Division of application No. 11/697,695, filed on Apr. 6, 2007, now Pat. No. 8,475,624, which is a continuation-in-part of application No. 11/237,327, filed on Sep. 27, 2005, now abandoned, and a continuation-in-part of application No. 11/440,561, filed on May 24, 2006, now Pat. No. 7,909,960.

(51) Int. Cl.
*B08B 5/00* (2006.01)
*H01L 21/02* (2006.01)
*B08B 7/00* (2006.01)
*H01J 37/32* (2006.01)

(52) U.S. Cl.
CPC ........ *H01L 21/02087* (2013.01); *B08B 7/0035* (2013.01); *H01J 37/32009* (2013.01); *H01J 37/3244* (2013.01); *H01J 37/32706* (2013.01); *Y10S 134/902* (2013.01)
USPC ............................... 134/1.2; 134/902; 216/67

(58) Field of Classification Search
CPC ................... H01L 21/02041; H01L 21/02046; H01L 21/02087; B08B 7/0035
USPC ................... 134/1.1, 1.2, 902; 216/67, 68, 71
See application file for complete search history.

(56) References Cited

U.S. PATENT DOCUMENTS 6,004,631 A * 12/1999 Mori ............................. 427/534
2001/0047979 A1 * 12/2001 Wang et al. .................... 216/49

* cited by examiner

*Primary Examiner* — Michael Kornakov
*Assistant Examiner* — Natasha Campbell
(74) *Attorney, Agent, or Firm* — Martine Penilla Group, LLP

(57) ABSTRACT

A plasma etch processing chamber configured to clean a bevel edge of a substrate is provided. The chamber includes a bottom edge electrode and a top edge electrode defined over the bottom edge electrode. The top edge electrode and the bottom edge electrode are configured to generate a cleaning plasma to clean the bevel edge of the substrate. The chamber includes a gas feed defined through a top surface of the processing chamber. The gas feed introduces a processing gas for striking the cleaning plasma at a location in the processing chamber that is between an axis of the substrate and the top edge electrode. A pump out port is defined through the top surface of the chamber and the pump out port located along a center axis of the substrate. A method for cleaning a bevel edge of a substrate is also provided.

6 Claims, 11 Drawing Sheets

METHOD FOR DISTRIBUTING GAS FOR A BEVEL ETCHER

CROSS REFERENCE TO RELATED APPLICATION

This application is a Divisional Application claiming priority from U.S. patent application Ser. No. 11/697,695, filed on Apr. 6, 200, (now U.S. Pat. No. 8,475,624), which is a continuation-in-part of U.S. patent application Ser. No. 11/237,327 filed on Sep. 27, 2005, and titled "Apparatus For The Removal Of A Set Of Byproducts From A Substrate Edge And Methods Therefor," and U.S. patent application Ser. No. 11/440,561 filed on May 24, 2006 (now U.S. Pat. No. 7,909,960). The disclosure of these applications are incorporated herein by reference in their entirety for all purposes.

BACKGROUND

The present invention relates in general to substrate manufacturing technologies and in particular to apparatus and methods for the removal etch byproducts from a bevel edge and a backside of a substrate.

In the processing of a substrate, e.g., a semiconductor substrate (or wafer) or a glass panel such as one used in flat panel display manufacturing, plasma is often employed. During substrate processing, the substrate (or wafer) is divided into a plurality of dies, or rectangular areas. Each of the plurality of dies will become an integrated circuit. The substrate is then processed in a series of steps in which materials are selectively removed (or etched) and deposited. Control of the transistor gate critical dimension (CD) on the order of a few nanometers is a top priority, as each nanometer deviation from the target gate length may translate directly into the operational speed and/or operability of these devices.

Typically, a substrate is coated with a thin film of hardened emulsion (such as a photoresist mask) prior to etching. Areas of the hardened emulsion are then selectively removed, causing parts of the underlying layer to become exposed. The substrate is then placed on a substrate support structure in a plasma processing chamber. An appropriate set of plasma gases is then introduced into the chamber and a plasma is generated to etch exposed areas of the substrate.

During an etch process, etch byproducts, for example polymers composed of Carbon (C), Oxygen (0), Nitrogen (N), Fluorine (F), etc., are often formed on the top and the bottom surfaces near a substrate edge (or bevel edge). Etch plasma density is normally lower near the edge of the substrate, which results in accumulation of polymer byproducts on the top and on the bottom surfaces of the substrate bevel edge. Typically, there are no dies present near the edge of the substrate, for example between about 2 mm to about 15 mm from the substrate edge. However, as successive byproduct polymer layers are deposited on the top and bottom surfaces of the bevel edge as a result of several different etch processes, organic bonds that are normally strong and adhesive will eventually weaken during subsequent processing steps. The polymer layers formed near the top and bottom surfaces of a substrate edge would then peel or flake off, often onto another substrate during substrate transport. For example, substrates are commonly moved in sets between plasma processing systems via substantially clean containers, often called cassettes. As a higher positioned substrate is repositioned in the container, byproduct particles (or flakes) may fall on a lower substrate where dies are present, potentially affecting device yield.

Etch byproducts can also be deposited on the backside of substrate support due to contamination or handling during the etching process. Since the substrate backside is not exposed to etching plasma, the byproduct polymer layer formed on the backside is not removed during subsequent etch processing steps. Therefore, the byproduct polymer layer can also accumulate on the substrate backside in a manner similar to the accumulation of polymer layer near the top and bottom surfaces of a substrate edge, and can result in particle problems. In addition, the interior of the process chamber, such as chamber walls, can also accumulate etch byproduct polymers, which needs to be removed periodically to avoid byproducts accumulation and chamber particle issues.

Dielectric films, such as SiN and $SiO_2$, and metal films, such as Al and Cu, can also be deposited on the bevel edge (including the top and bottom surfaces) and do not get removed during etching processes. These films can also accumulate and flake off during subsequent processing steps, thereby impacting device yield.

In view of the foregoing, there is a need for apparatus and methods that provide improved mechanisms of removal of etch byproducts, dielectric films and metal films near the substrate bevel edge, and etch byproducts on substrate backside and chamber interior to avoid accumulation of polymer byproducts and deposited films and to improve process yield.

SUMMARY

Broadly speaking, the embodiments fill the need by providing a method and system for cleaning a bevel edge of a wafer. It should be appreciated that the present invention can be implemented in numerous ways, including as a solution, a method, a process, an apparatus, or a system. Several inventive embodiments of the present invention are described below.

In one embodiment, a plasma etch processing chamber configured to clean a bevel edge of a substrate is provided. The chamber includes a bottom edge electrode surrounding a substrate support of the plasma processing chamber. The substrate support is configured to receive the substrate and the bottom edge electrode and the substrate support are electrically isolated from each other by a bottom dielectric ring. The chamber includes a top edge electrode defined over the bottom edge electrode. The top edge electrode and the bottom edge electrode are configured to generate a cleaning plasma to clean the bevel edge of the substrate. The chamber includes a gas feed defined through a top surface of the processing chamber. The gas feed introduces a processing gas for striking the cleaning plasma at a location in the processing chamber that is between an axis of the substrate and the top edge electrode. A pump out port is defined through the top surface of the chamber and the pump out port located along a center axis of the substrate. In an alternative embodiment, the gas feed is located through a bottom or a side of the processing chamber.

In another embodiment, a method for cleaning a bevel edge of a wafer is provided. The method initiates with flowing a process gas through one of a side region or a bottom region of a chamber. A plasma is generated with the process gas proximate to the bevel edge of the wafer and the chamber is pumped out through a top outlet of the chamber located along an axis of the wafer while flowing the process gas.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 4AA is an enlarged schematic diagram of region B in FIG. 4A.

DETAILED DESCRIPTION

Several exemplary embodiments are disclosed, which define a method and system that selectively etches the bevel edge of the substrate, as well as providing a more efficient pump down and chamber pressure control. It should be appreciated that the present invention can be implemented in numerous ways, including a process, a method, an apparatus, or a system. Several inventive embodiments of the present invention are described below. It will be apparent to those skilled in the art that the present invention may be practiced without some or all of the specific details set forth herein.

The embodiments described herein provide a system and method to etch a bevel edge region of a substrate while not etching, i.e., both chemical and physical types of etching, a center region of the top of the substrate. For systems with a center gas feed, it is suggested that the center gas flow provides the means to prevent radicals from coming into the center region. The embodiments described herein enable introduction of a processing gas through an off axis top port, a side port or a bottom port. A pump out port defined through the chamber top is provided and in one embodiment, the top pump out port is aligned with an axis of the substrate. In another embodiment, the chamber is configured to provide for more efficient pump-downs between processing operations, without sacrificing pressure control capabilities during the processing operations. This is achieved through a valve assembly having a main shut-off valve in parallel with a smaller throttle valve and corresponding smaller shut of valve included in a bypass around the main shut off valve.

Figure 1:
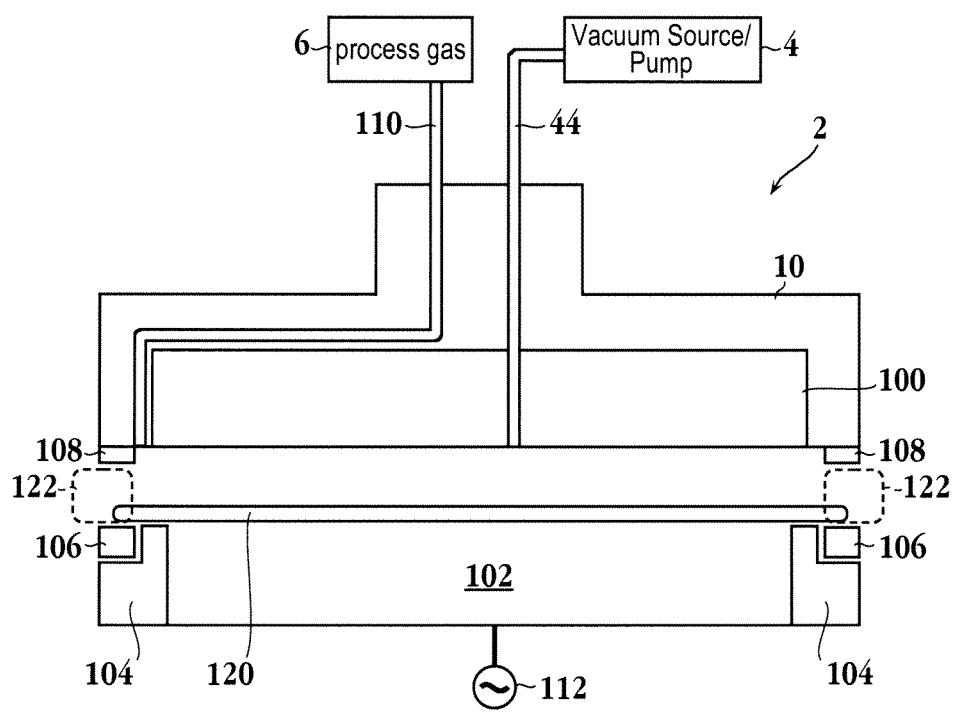
FIG. 1 is a simplified schematic diagram illustrating an exemplary cross section view of a processing chamber in accordance with one embodiment of the invention.

FIG. 1 is a simplified schematic diagram illustrating an exemplary cross section view of a processing chamber in accordance with one embodiment of the invention. In one embodiment, the processing chamber described herein is a bevel edge etching system where gas may be fed from various regions in order to etch the edge of a substrate or wafer disposed within the chamber. The etching of the edge region cleans this area from byproducts disposed thereon. Bevel edge etch chamber 2 includes a channel 44 through a center region of an upper electrode assembly 10 of the chamber top and allowing access into the reaction chamber where a wafer is processed. Channel 44 is connected at one end to vacuum supply/pump 4. Reaction chamber 2 includes top insulator block 100 disposed over bottom electrode 102, which is powered by radio frequency (RF) generator 112. It should be noted that bottom electrode 102 may also be referred to as a powered substrate support. Gas supply 110 will supply gas to a region proximate to the edge of wafer 120 from process gas supply 6. Top ground electrode 108 is disposed over a peripheral edge region of wafer 120, i.e., the bevel edge region of the wafer. Bottom ground electrode 106 is disposed under an edge region of wafer 120 and opposes top electrode 108. It should be appreciated that bottom electrode 106 and top electrode 108 are grounded in one embodiment. Dielectric 104 electrically isolates bottom electrode 106 from bottom electrode 102. Of course, electrodes 106 and 108 may be powered in another embodiment. Within region 122, a plasma is struck between electrodes 108 and 106. By applying a vacuum source, or a pump, to pump out from channel 44, the pressure gradient within reaction chamber 2 may be adjusted during the cleaning of the bevel edge.

While FIG. 1 illustrates the entry of the process gas in a location proximate to plasma region 122, the embodiments are not limited to this configuration. That is, the process gas can be introduced anywhere between an inner surface of electrode 108 and channel 44. One skilled in the art will appreciate that changing the entry location of the process gas through the top of the chamber, the pressure profile experienced by the substrate may be manipulated. In an alternative embodiment, an inert gas may be pumped through center feed/channel 44 of chamber 2 while a process gas is delivered to the outer periphery or edge region of the chamber which is proximate to the bevel edge of the wafer. Thus, the plasma would be struck in the edge region while the etch process gas is flowing and the inert gas flows into the center region. The flow rate of the inert gas in the center region may be used to manipulate a pressure experienced by the wafer similar to the pump out procedure described herein. Through the embodiments described herein, one exemplary pressure gradient may be defined as the center region of the wafer experiencing a pressure of about 50 Torr, while the outer edge of the wafer is exposed to a pressure of about 2 Torr. Of course this range can be reversed through the embodiments described above as channel 44 may be used to supply a gas to increase the pressure or channel 44 may be used to pump out the region of the chamber to reduce the pressure. One skilled in the art will appreciate that the distance from a top surface of wafer 122 and the bottom of insulator block 100 is about 4 millimeters in one embodiment, thus allowing the pressure gradients to exist.

Figure 2A:
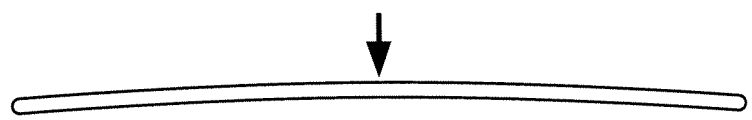
FIGS. 2A-2C illustrate exemplary configurations of substrates that may be accommodated through the manipulation of the pressure profile across the substrate.
Figure 2B:
Figure 2C:
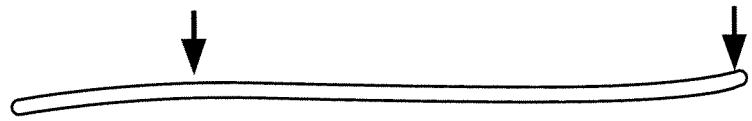

FIGS. 2A-2C illustrate exemplary configurations of substrates that may be accommodated through the manipulation of the pressure profile across the substrate. In FIG. 2A the wafer has a convex shape. Thus, the pressure experienced by the center region can be greater than the pressure on the edge region in order to flatten the wafer. Alternatively, if the wafer has a concave shape as illustrated by FIG. 2B, greater pressure may be applied along the edge region while pumping out of channel 44 to reduce the pressure on the center region in order to again flatten the wafer. The pressure differential zones within the chamber may be created by the location of the introduction of the processing gas into the reaction chamber and the rate at which gas is pumped out of channel 44. In one embodiment, the pump out rate may be adjusted to create concentric pressure gradients across the top surface of wafer in accordance with one embodiment. FIG. 2C illustrates a substrate that has both convex and concave warping. In this embodiment, a pressure gradient may be applied that forces a downward pressure as indicated by the arrows to flatten the substrate. By manipulating the application of channel 44 between a pump out port and a supply port, along with the location of the process gas, the various deformations of the wafer may be accommodated.

Figure 3A:
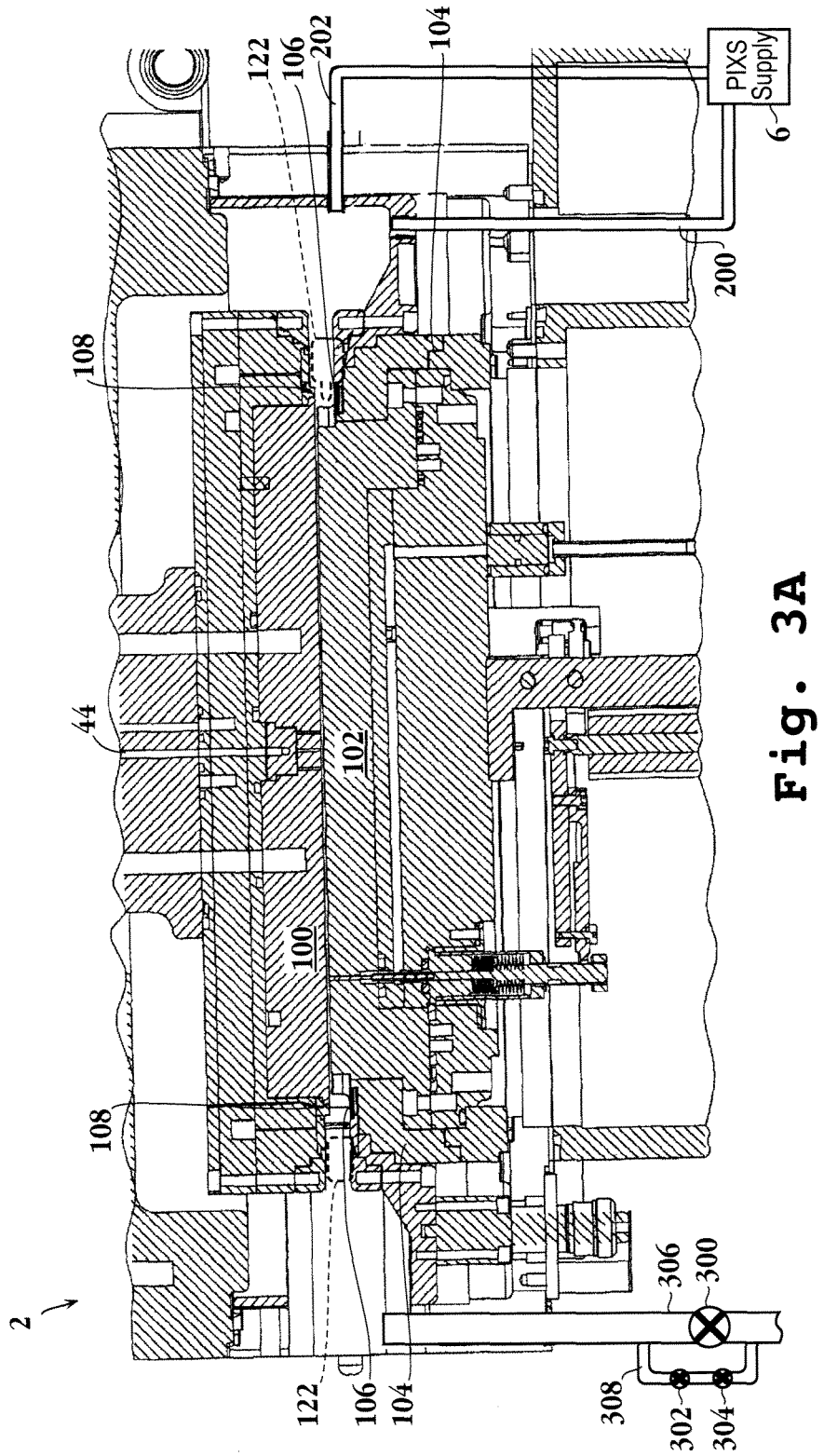
FIG. 3A is a simplified schematic diagram illustrating a reaction chamber having the capability of a bottom gas feed or a side gas feed in accordance with one embodiment of the invention.

FIG. 3A is a simplified schematic diagram illustrating a reaction chamber having the capability of a bottom gas feed or a side gas feed in accordance with one embodiment of the invention. Chamber 2 is illustrated as having bottom gas feed 200 which may be used to deliver a process gas from gas supply 6 to create a plasma in region 122, which is proximate to a bevel edge of a wafer to be processed. Ground electrodes 108 and 106, in conjunction with powered bottom electrode 102, may be used to create the plasma within region 122 from the process gas being delivered through bottom gas feed 200. Alternatively, side gas feed 202 may be used to introduce a process gas into region 122. Side gas feed 202 will deliver the process gas from gas supply 6 so that a plasma may be struck in region 122 to clean the bevel edge of a wafer disposed within reaction chamber 2. It should be appreciated that in these embodiments the gas feed line can be hard piped, i.e., no flex lines are needed, as is required when the gas is delivered through a chamber top. It should be appreciated that when gas is delivered through the chamber top, which is removable, the gas lines must be able to accommodate the removability of the chamber top. Furthermore, since gas feeds 202 and 200 are hard piped, the need for a filter to protect against particulates is eliminated. With flex lines a filter is required to be utilized to protect against particulates. This filter then becomes restrictive on a pump down rate. With the gas feeds at the side and/or bottom, this filter may be eliminated so that the pump down rate is not restricted. While both a side gas feed and a bottom gas feed are depicted in FIG. 3A, it should be noted that one or both may be included and the embodiments are not to be limited to both gas feeds being present.

FIG. 3A further includes a valve assembly for an improved technique for pumping down a chamber quickly and controlling a pressure in the chamber during processing more accurately in accordance with one embodiment of the invention. For a serial configuration of a shutoff valve and throttle valve, the throttle valve is sized the same as the shut off valve, which is relatively large in order to accommodate the pump down rate. However, the constriction on the throttle valve, i.e., the size limitation, causes the throttle valve to be substantially closed during processing. With the throttle valve substantially closed, due to the relatively large size, the amount of control exerted over the chamber pressure is restricted. The valve configuration of FIG. 3A enables the pump down of the chamber quickly, while allowing an optimally sized throttle valve for use during processing operations to better control the chamber pressure. In FIG. 3, shut off valve 300 is sized large in order to maintain a pump down rate. However, bypass line 308 in conjunction with throttle valve 302 and shutoff valve 304 avoid the need for a large shutoff valve. In this embodiment, throttle valve 302 and shutoff valve 304 define a parallel bypass to shut off valve 300, which may be used during processing so that throttle valve 302 may control the process more effectively. That is, throttle valve 302 is sized accordingly so that the throttle valve is maintained in a "sweet spot" for pressure control, i.e., open near the middle of the operating range of the valve. Thus, when pumping down, shutoff valve 300 will be used to maintain a fast pump down rate through line 306 which has a larger diameter. When processing, shutoff valve 304 and throttle valve 302 are used to control the process. Thus, when processing, shutoff valve 300 is in an off position, while shutoff valve 304 and throttle valve 302 are open. Conversely, when pumping down the chamber shutoff valve 300 is open, while throttle valve 302 and shutoff valve 304 are closed, or at least shut off valve 304 is closed in one embodiment. One skilled in the art will appreciate that the valves may be controlled through a controller, that similarly controls the introduction of the process gas from corresponding gas feeds.

Figure 3B:
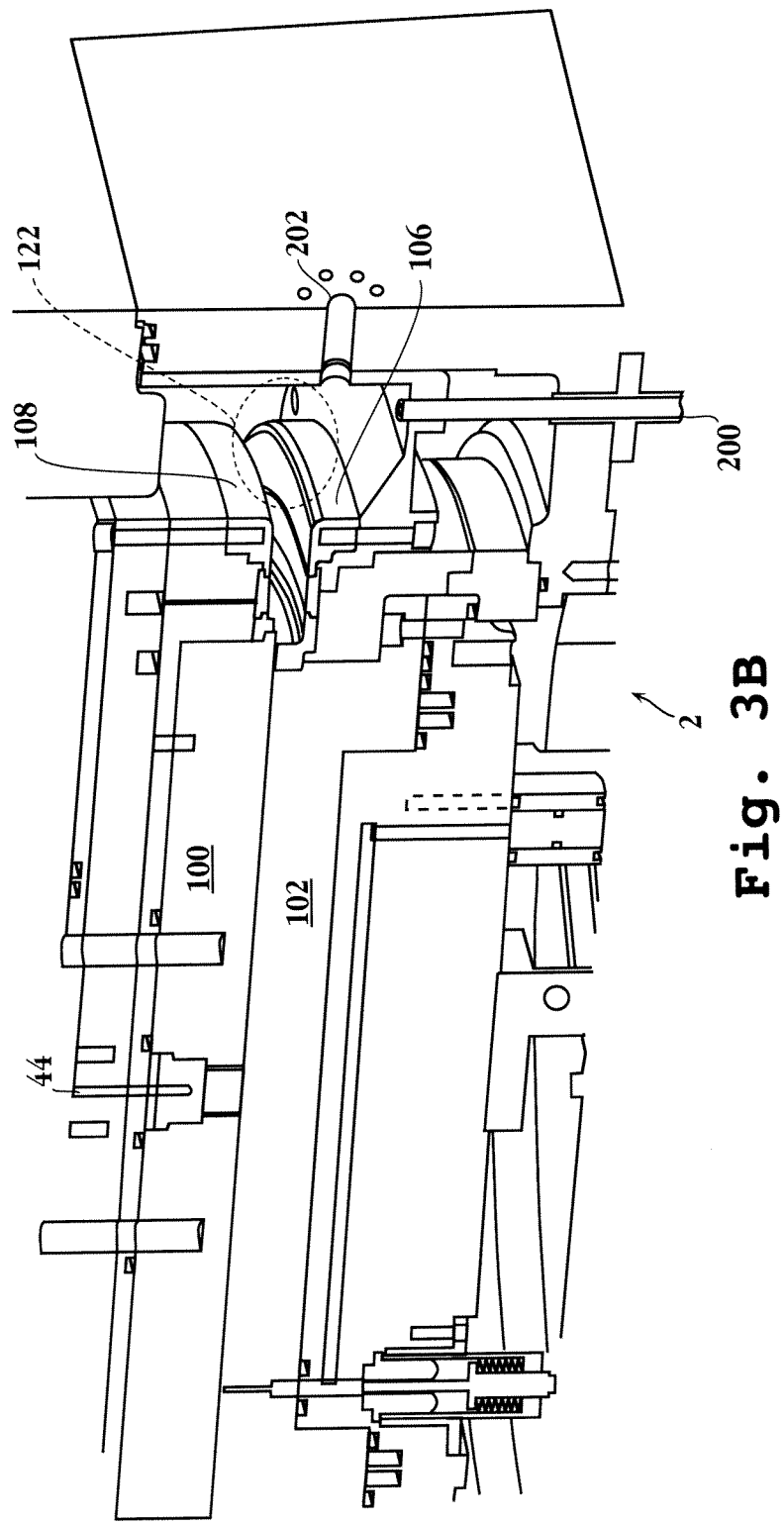
FIG. 3B is a perspective view illustrating a reaction chamber having the capability of a bottom gas feed or a side gas feed in accordance with one embodiment of the invention.

FIG. 3B is a perspective view illustrating a reaction chamber having the capability of a bottom gas feed or a side gas feed in accordance with one embodiment of the invention. As illustrated, chamber 2 includes powered substrate support 102 and top insulator block 100. A top pump out port 44 is defined within insulator block 100. Electrodes 106 and 108 are annular rings defined below and above, respectively, the bevel edge region of a substrate being processed. Feed gas supplies 200 and 202 supply gas from a bottom region of the chamber and a side region of the chamber, respectively. The gas is supplied in the vicinity of region 122, where a plasma is generated from the feed gas to clean the bevel edge of a wafer. It should be appreciated that while a single feed line is illustrated for each of feed supplies 200 and 202, the embodiments are not limited to this structure. For example, feed supplies 200 and 202 may supply a plenum that is configured to deliver a supply gas uniformly around the outer peripheral region of electrodes 106 and 108. In one embodiment, the plenum is an annular ring having holes distributed along an outer surface to evenly distribute the process gas is defined within this region accomplishes this functional requirement.

Figure 4A:
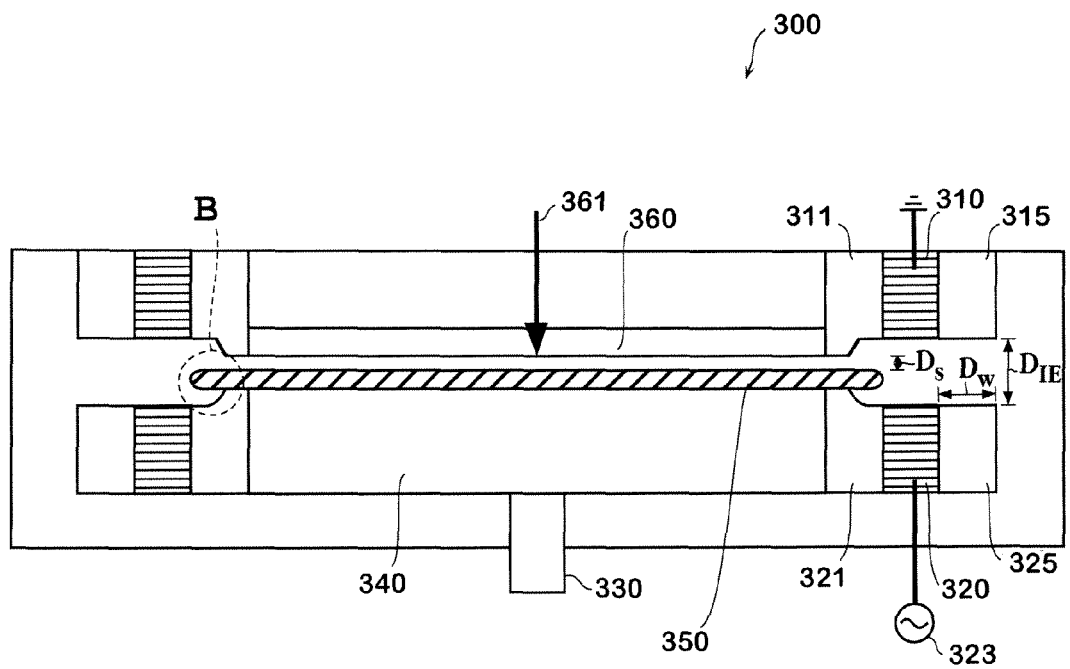
FIG. 4A shows a schematic diagram of one embodiment of a substrate etching system with a pair of top and bottom edge electrodes.
Figure 4A:
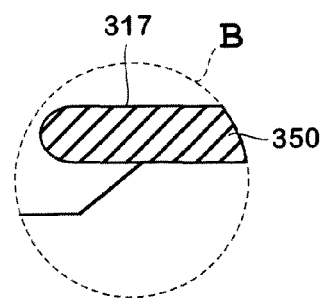

FIG. 4A shows an embodiment of an etch process chamber 300. Chamber 300 has a substrate support 340 with a substrate 350 on top. In one embodiment, the substrate support 340 is an electrostatic chuck, which is powered by a RF (radio frequency) power source (not shown). In another embodiment, the substrate support 340 is a regular electrode. The substrate support 340 can be DC (direct current) or RF biased. Opposing the substrate support 340 is a gas distribution plate 360 with a gas feed 361. The substrate support can also be RF powered, biased, or grounded. During etching of substrate 350, chamber 300 can be RF powered to generate capacitively coupled etch plasma or inductively coupled etch plasma. The substrate 350 has a bevel edge 317 that includes a top and a bottom surface of the edge of the substrate, as shown in region B of FIG. 4A and enlarged region B in FIG. 4AA. In FIG. 4AA, bevel edge 317 is highlighted as a bold solid line and curve.

Surrounding the edge of substrate support 340, there is a bottom edge electrode 320, made of conductive materials, such as aluminum (Al). Between the substrate support 340 and the bottom edge electrode 320, there is a bottom dielectric ring 321 electrically separating the substrate support 340 and the bottom edge electrode 320. In one embodiment, substrate 350 is not in contact with the bottom edge electrode 320. Beyond the bottom edge electrode 320, there is another bottom insulating ring 325, which extends the surface of the bottom edge electrode 320 facing substrate 350.

Surrounding the gas distribution plate 360, there is a top edge electrode 310, made of conductive materials, such as aluminum (Al). The top edge electrode 310 is electrically insulated from the gas distribution plate 360 by a top dielectric ring 311. Beyond the top edge electrode 310, there is top insulating ring 315, which extends the surface of the top edge electrode 310 facing substrate 350.

In one embodiment, the bottom edge electrode 320 is coupled to a RF power source 323 and the top edge electrode 310 is grounded. During a substrate bevel edge cleaning process, the RF power source 323 supplies RF power at a frequency between about 2 MHz to about 13 MHz and a power between about 100 watts to about 2000 watts to generate a cleaning plasma. During bevel edge cleaning the substrate support 340 and the gas distribution plate 360 are kept electrically floating. The cleaning plasma is configured to be confined by the top dielectric ring 311, top edge electrode 310, the top insulating ring 315, the bottom dielectric ring 321, the bottom edge electrode 320, and the bottom insulating ring. The cleaning gas(es) is supplied through the gas feed 361. In one embodiment, the gas feed is located near the center of the gas distribution plate 360. Alternatively, the cleaning gas(es) can also be supplied through gas feed(s) disposed in other parts of the process chamber 300.

To clean etch byproduct polymers, cleaning gases can include an oxygen-containing gas, such as $O_2$. Some amount, such as <10%, of a fluorine-containing gas, such as $CF_4$, $SF_6$, or $C_2F_6$, can also be added to clean the polymer in one embodiment. It should be appreciated that nitrogen-containing gas, such as $N_2$, can also be included in the gas mixture. The nitrogen-containing gas assists dissociation of the oxygen-containing gas. An inert gas, such as Ar or He, can also be added to dilute the gas and/or to maintain the plasma. To clean a dielectric film(s), such as SiN or $SiO_2$, at the bevel edge 317, a fluorine-containing gas, such as $CF_4$, $SF_6$, or a combination of both gases, can be used. An inert gas, such as Ar or He, can also be used to dilute the fluorine-containing gas and/or to maintain the cleaning plasma. To clean a metal film(s), such as Al or Cu, at the bevel edge 317, a chlorine-containing gas, such as $Cl_2$, or $BCl_3$, or a combination of both gases, can be used. An inert gas, such as Ar or He, can also be used to dilute the chlorine-containing gas and/or to maintain the plasma to clean the metal film(s).

In one embodiment, the space between the top edge electrode 310 and the bottom edge electrode 320, $D_{EE}$, is less than 1.5 cm to ensure the plasma is confined. A $D_{EE}$ of less than 1.5 cm allows the ratio between the width ($D_W$) and gap ($D_{EE}$) of the opening near substrate edge to be less than 4:1, which ensures plasma confinement. $D_W$ is the width of the opening near the substrate edge. In one embodiment, $D_W$ is the width of the bottom insulating ring 325 or the width of the top insulating ring 315. The chamber pressure is kept between about 100 mTorr to about 2 Ton during the bevel edge cleaning process. The spacing between the gas distribution plate 360 and substrate 350, $D_S$, is less than 0.6 mm to ensure no plasma is formed between the top electrode 360 and the substrate 350 during the bevel edge cleaning process.

In another embodiment, the RF power supply can be coupled to the top edge electrode 310, while the bottom edge electrode 320 is grounded to generate the capacitively coupled cleaning plasma. Alternatively, either the top edge electrode 310 or the bottom edge electrode 320 can be replaced with an inductive coil buried in a dielectric material. In this embodiment, the inductive coil is coupled to a RF power source and the opposing edge electrode is grounded. The RF power source supplies power to generate an inductively coupled etch plasma to clean the bevel edge 317.

The plasma generated near the substrate edge and between the top edge electrode 310 and the bottom edge electrode 320 cleans the substrate bevel edge of the substrate. The cleaning helps reduce the build-up of polymer at the substrate bevel edge, which reduces or eliminates the possibility of particle defects impacting device yield.

Figure 4B:
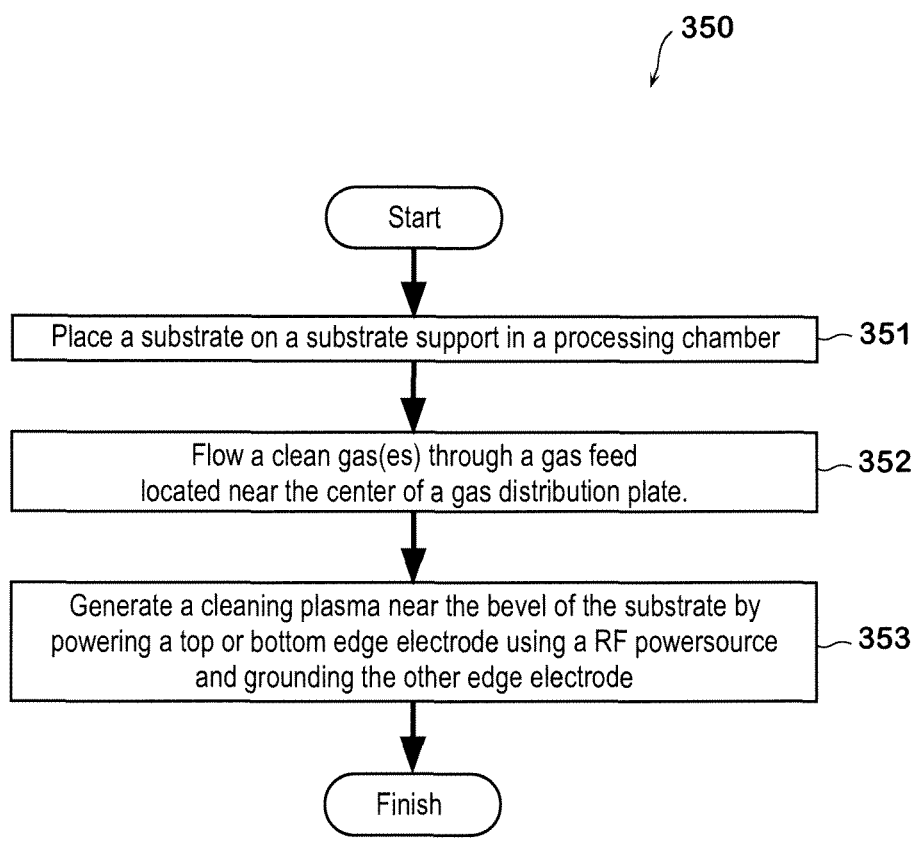
FIG. 4B shows a process flow of using the top and bottom edge electrodes of FIG. 4A to etch byproducts near substrate bevel edge.

FIG. 4B shows an embodiment of a process flow 350 for cleaning the bevel edge of the substrate. The process starts at step 351 by placing a substrate on a substrate support in a processing chamber. The process is followed by flowing a cleaning gas(es) through a gas feed located near the center of the gas distribution plate at step 352. At step 353, a cleaning plasma is then generated near the bevel edge of the substrate by powering either the top or the bottom edge electrode using a RF power source and by grounding the edge electrode that is not powered by the RF source.

Figure 4C:
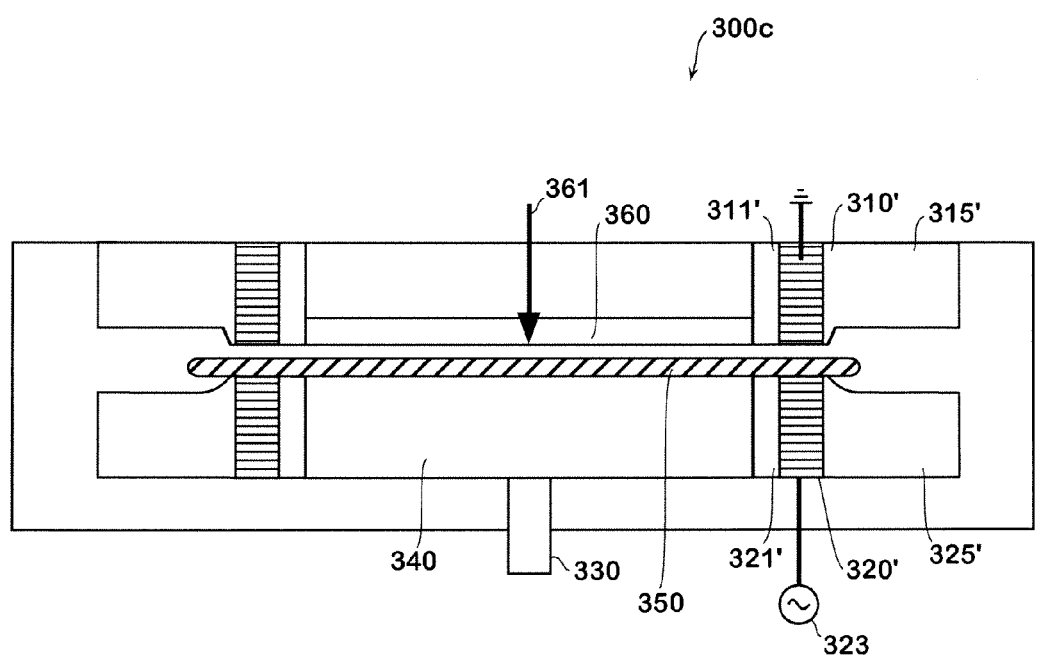
FIG. 4C shows a schematic diagram of another embodiment of a substrate etching system with a pair of top and bottom edge electrodes.

FIG. 4C shows another embodiment of the bevel edge cleaning mechanism. The components in the process chamber 300C of this embodiment is very similar to those shown in FIG. 4A. The difference is that, in this embodiment, the bottom edge electrode 320' is moved inward to be in contact with a bottom surface of the substrate 350. The bottom edge electrode 320' is fully under the substrate 350 to ensure that the bottom edge electrode 320' does not get sputtered during cleaning process. The RF power supply 323 supplies a RF power that is transmitted through the substrate 350 to generate a cleaning plasma with the grounded top edge electrode 310. The cleaning plasma cleans the bevel edge. Due to direct RF through the substrate, the substrate has higher DC potential, compared to the embodiment shown in FIG. 4A. The higher DC potential on the substrate results in higher ion energy and a higher etch rate.

Figure 4D:
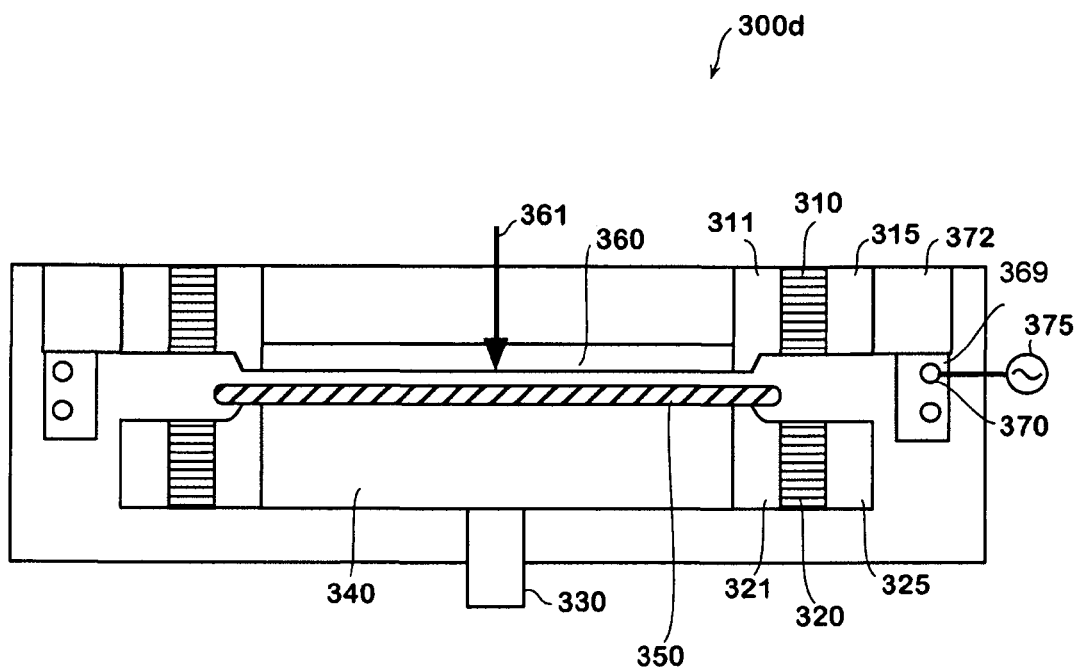
FIG. 4D shows a schematic diagram of an embodiment of a substrate etching system with a pair top and bottom edge electrodes, and surrounding inductive coils.

FIG. 4D shows another embodiment of the bevel edge cleaning apparatus. In this embodiment, the components in the process chamber 300D are similar to those in FIG. 4A. The difference is that an inductive coil(s) 370 surrounds the substrate bevel and the space between the top edge electrode 310 and the bottom edge electrode 320. The inductive coil 370 is embedded in a dielectric material 369 and is coupled to a RF power supply 375. In one embodiment, the dielectric material 369 is coupled to a dielectric support 372.

The inductive coil(s) 370 is coupled to a RF power source 375. During the bevel cleaning process, the RF power source 375 supplies RF power in a range between about 2 MHz to about 13 MHz to generate an inductive plasma near the substrate bevel, in one embodiment. The top edge electrode 310 and the bottom edge electrode 320 are both grounded to provide a returning path for the inductive plasma. The plasma generated can efficiently clean the bevel edge and the substrate backside. Inductive coil 370 can provide a high density plasma to efficiently clean the bevel edge.

The inductive coil 370 shown in FIG. 4D can also be used to generate plasma to clean the substrate backside and chamber wall. During substrate backside cleaning, the substrate 350 is raised up to be away from the substrate support 340 by lift pins (not shown). In one embodiment, the pressure in the process chamber is kept below 500 mTorr. The lower chamber pressure allows the cleaning plasma to diffuse under the backside of the substrate. For substrate backside cleaning, the distance requirement between the gas distribution plate 360 and substrate 350, $D_s$, still needs to be kept below 0.6 mm to ensure plasma does not form between the gas distribution plate 360 and the substrate 350. However, the space between the top edge electrode 310 and the bottom edge electrode 320, $D_{EE}$, is no longer needed. Cleaning plasma does not need to be confined between the top edge electrode 310 and bottom edge electrode 320 or between the top insulating ring 315 and bottom insulating ring 325. The cleaning plasma needs to diffuse under raised substrate 350 to clean the substrate backside. It should be appreciated that configurations and processes similar to the ones used to clean the substrate backside can also be used to clean the etch byproducts accumulated in the chamber interior, including the chamber walls. During chamber interior cleaning, the substrate can stay in the chamber or can be removed from the chamber. In one embodiment, substrate backside cleaning and chamber interior cleaning can occur simultaneously.

Figure 4E:
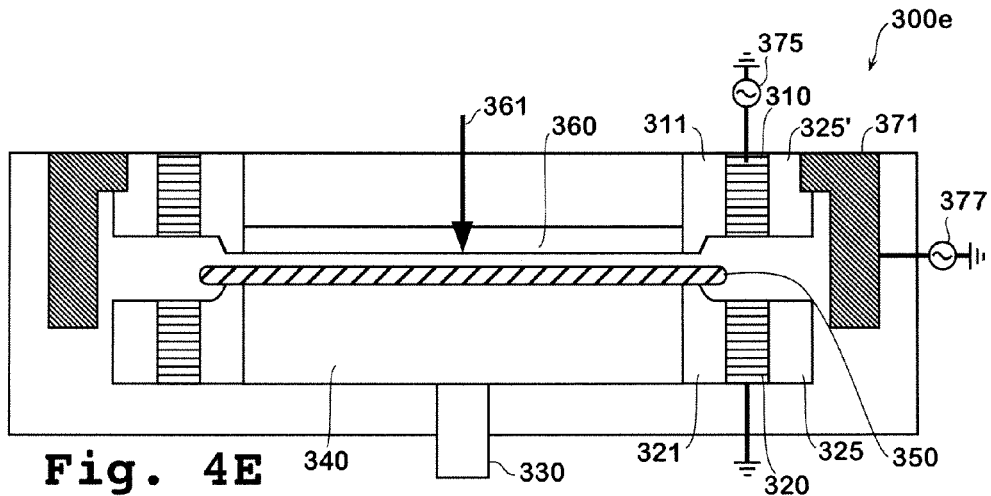
FIG. 4E shows a schematic diagram of an embodiment of a substrate etching system with a pair of top and bottom edge electrodes, and an overhang electrode surrounding the pair of edge electrodes.

As described above, capacitively coupled plasma can also be used to clean bevel edge and to clean substrate backside. To clean the bevel edge, the frequency of RF power used is between about 2 MHz to about 13 MHz. To clean the chamber edge, the frequency of RF power is between about 27 MHz to about 60 MHz. FIG. 4E shows another embodiment that allows cleaning the bevel edge, substrate backside and chamber interior using dual RF frequencies. In this embodiment, a conductive overhang 371 is placed surrounding the opening between the top edge electrode 310 and the bottom edge electrode 320. In one embodiment, the conductive overhang 371 is coupled to a high-frequency RF power source 377, the top edge electrode 310 is coupled to a low-frequency RF power source 375, and the bottom edge electrode 320 is grounded. The high-frequency RF power has a frequency between about 27 MHz to about 60 MHz. The low-frequency RF power has a frequency between about 2 MHz to about 13 MHz. During substrate backside and chamber interior cleaning, the high-frequency RF power source 377 supplies the RF power to generate cleaning plasma. The top electrode 310 is grounded. In one embodiment, the chamber pressure is kept below 500 mTorr. The substrate is raised above the substrate support by the lift pins (not shown). The spacing requirement between the top edge electrode and the bottom edge electrode of <1.5 cm is no longer needed. Cleaning plasma needs to diffuse under substrate backside and diffuse to other parts of the chamber interior for cleaning. However, the spacing requirement between the gas distribution plate 360 and the substrate 350 of <0.6 mm is still needed to ensure plasma does not form between the gas distribution plate 360 and the substrate 350. The relatively low chamber pressure of less than 500 mTorr allows the process plasma to discuss beneath the substrate and the chamber cleaning plasma can clean the entire chamber.

During the bevel edge cleaning, the low-frequency RF power source 375 supplies the RF power to generate cleaning plasma. The conductive overhang is grounded. In one embodiment, the chamber pressure is kept between about 100 mTorr to about 2 Torr. The spacing requirement between the top edge electrode and the bottom edge electrode of <1.5 cm and the spacing requirement between the gas distribution plate 360 and the substrate 350 of <0.6 mm needs to be complied within this embodiment to ensure the plasma is confined and is not formed between the gas distribution plate 360 and the substrate 350.

Figure 4F:
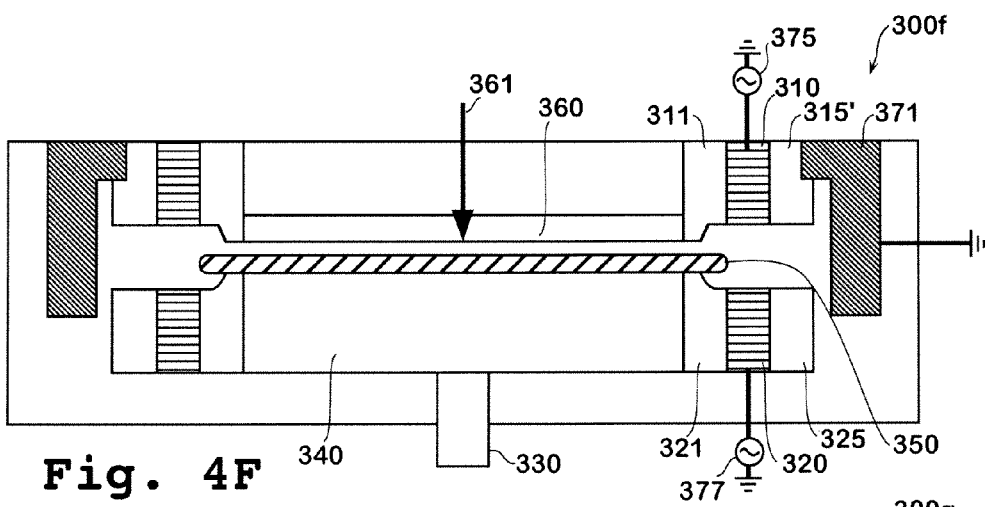
FIG. 4F shows a schematic diagram of another embodiment of a substrate etching system with a pair of top and bottom edge electrodes, and an overhang electrode surrounding the pair of edge electrodes.

In another embodiment (shown in FIG. 4F), the top edge electrode 310 is coupled to a low-frequency RF power supply 375 and the bottom edge electrode 320 is coupled to a high-frequency RF power supply 377. The conductive overhang 371 is grounded. The process conditions and configurations are similar to those discussed in the embodiment of FIG. 4E. Alternatively, the top edge electrode 310 can be coupled to a high-frequency RF, between about 27 MHz to about 60 MHz, power supply 377 and the bottom edge electrode 320 can be coupled to a low-frequency RF, between about 2 MHz to about 13 MHz, power supply.

Figure 4G:
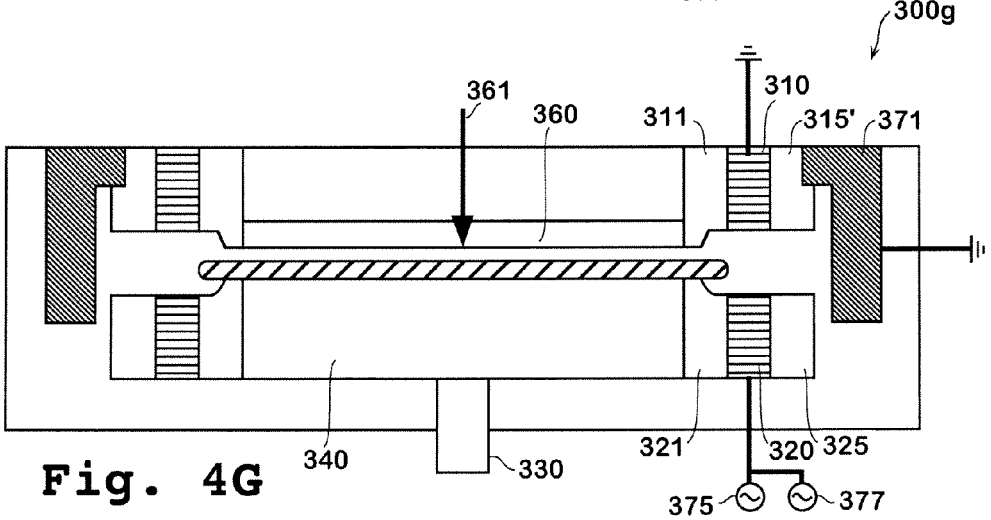
FIG. 4G shows a schematic diagram of yet another embodiment of a substrate etching system with a pair of top and bottom edge electrodes, and an overhang electrode surrounding the pair of edge electrodes.

In yet another embodiment (shown in FIG. 4G), both the top edge electrode 310 and the conductive overhang 371 are grounded. The bottom edge electrode 320 is coupled to two RF power supplies 375, 377 that can supply two types of RF power, one between about 2 MHz and about 13 MHz and the other between about 27 MHz and about 60 MHz. During bevel cleaning, the RF supply that supplies between about 2 MHz to about 13 MHz is turned on. During substrate backside cleaning, the RF power supply that supplies power between about 27 MHz and about 60 MHz is turned on. Alternatively, the top edge electrode 310 can be coupled to two RF power supplies 375 and 377, while the bottom edge electrode 320 and the conductive overhang 371 are grounded.

Figure 4H:
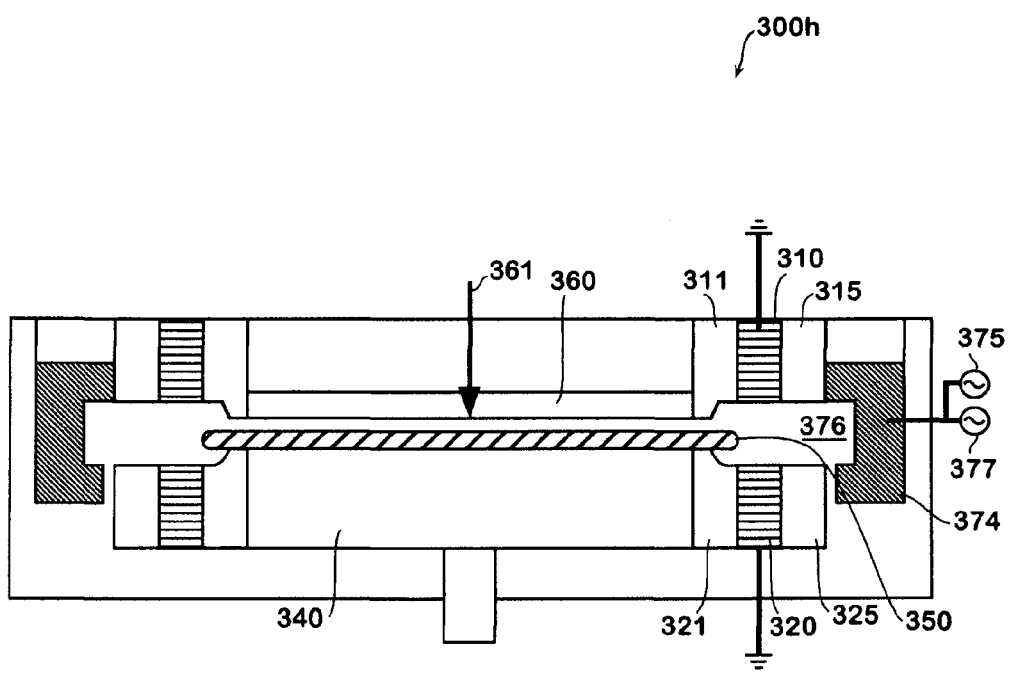
FIG. 4H shows a schematic diagram of an embodiment of a substrate etching system with a pair of top and bottom edge electrodes, and a hollow cathode electrode surrounding the pair of edge electrodes.

In another embodiment as shown in FIG. 4H. Outside the dielectric rings 315 and 325 that surround the top edge electrode 310 and the bottom edge electrode 320 respectively, there is a hollow cathode ring 374, which is made of a conductive material, such as aluminum (Al). The hollow cathode ring 374 has an opening 376 that faces the bevel edge. In one embodiment, the width of the opening 376 is greater than about 1.0 cm. The hollow cathode ring is coupled to an RF power source 375 and both the top edge electrode 310 and the bottom edge electrode 320 are grounded. The gas distribution plate 360 and substrate support 340 are kept floating in this embodiment. In one embodiment, the hollow cathode ring 374 is powered by the RF power supply 375 to generate a plasma processing gas to clean the bevel edge. RF power supply 375 supplies between about 2 MHz to about 13 MHz. In another embodiment, the hollow cathode ring 374 is powered by the RF power supply 377 to generate a plasma processing gas to clean the substrate backside and/or chamber interior. RF power supply 377 supplies power between about 27 MHz and about 60 MHz. In one embodiment, the process gas is supplied through a gas feed 361 near the substrate center. Hollow cathode ring 374 generates a high-density plasma, for example in the range between about 1E10 to about 1E11, that is very efficient in cleaning the bevel edge. For this embodiment, the spacing requirement between the top edge electrode 310 and bottom edge electrode 320, $D_{EE}$, of less than 1.5 cm is no longer needed. However, the requirement between the gas distribution plate 360 and the substrate 350 is still needed to ensure no plasma is formed between the top distribution plate 360 and the substrate 350.

Figure 5:
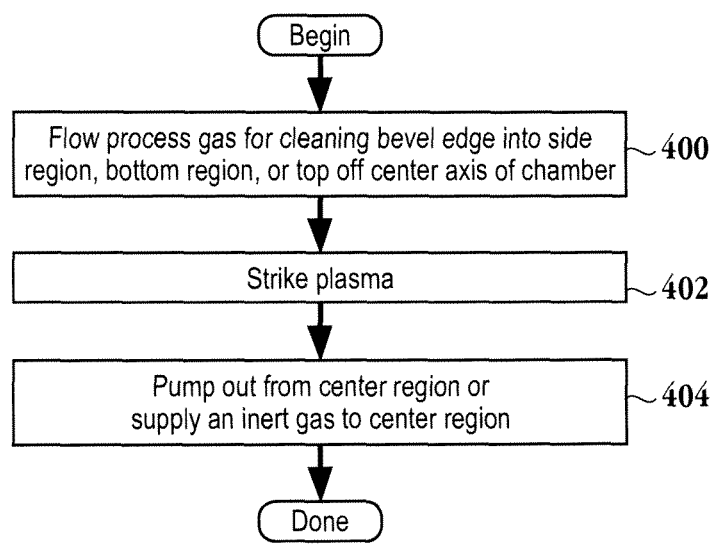
FIG. 5 is a flow chart diagram illustrating the method operations for processing the bevel edge of a wafer in accordance with one embodiment of the invention.

FIG. 5 is a flow chart diagram illustrating the method operations for processing the bevel edge of a wafer in accordance with one embodiment of the invention. The method initiates with operation 400 where a process gas flows into either a side region or a bottom region of the chamber. It should be appreciated that the process gas is hard piped into the process chamber as illustrated in FIGS. 3A and 3B. It should be noted that the process gas may be provided from a top region that is between an axis of the wafer being processed and the peripheral edge of the wafer as discussed above with regard to FIG. 1. A plasma is generated from the process gas in operation 402, where the plasma is proximate to an outer peripheral region of the wafer, i.e., the bevel edge of the wafer. Exemplary process gases and combinations of process gases for performing the bevel edge cleaning are provided in U.S. application Ser. Nos. 11/237,327 and 11/440,561. While flowing the gas into either of the side or bottom regions, the chamber is pumped out from a center region above the wafer to be processed as specified in operation 404. Alternatively, an inert gas may be pumped into the center region as mentioned above with reference to FIG. 1. As described with regard to FIGS. 1 and 2A-2C, the pump out of the chamber from the center region can be used to manipulate or affect a pressure gradient across the wafer surface in order to correct any deformations in the wafer. That is, if the wafer is bowed or curved, the pressure gradient may be adjusted in order to manipulate the wafer so the wafer is flattened to assist in the processing uniformity.

It should be appreciated that the embodiments described herein in any of the Figures may be integrated together. For example, the parallel shut off/throttle valve configuration of FIGS. 3A and 3B may be incorporated with the configuration of FIG. 1. In addition, the center pump out may be integrated with a side or bottom gas feed. Thus, through the different combinations an optimal processing configuration may be designed depending on the user's preference.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, such as the carrier network discussed above, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention. In the claims, elements and/or steps do not imply any particular order of operation, unless explicitly stated in the claims.

What is claimed is:

1. A method for cleaning a bevel edge of a wafer in a chamber having a wafer support, the chamber used for plasma etching of the bevel edge, comprising:
    positioning the wafer on the wafer support, wherein a periphery of the wafer extends beyond an edge of the wafer support, the chamber having a distribution plate parallel to the wafer and spaced apart from a top surface of the wafer not more than 0.6 mm, and a region where the wafer extends beyond the edge of the wafer support is where the bevel edge of the wafer resides during plasma etching;
    flowing a process gas to a periphery of the chamber proximate to the bevel edge of the wafer;
    pumping an inert gas into a center region of the chamber, the pumping being controlled to define a pressure gradient across the wafer to correct deformations in the wafer;
    generating a plasma with the process gas proximate to the bevel edge of the wafer to start processing of the bevel edge;
    throttling a process pump down rate of the chamber proximate to the bevel edge during the processing via a bypass line, such that a pressure of the chamber is controlled during the processing; and
    pumping down the chamber upon completing the processing, the pumping down being enhanced via a pumping line that is parallel to the bypass line, the pumping line having a greater diameter than the bypass line.

2. The method of claim 1, wherein the pressure gradient acts to manipulate the wafer so as to flatten a curved or bowed wafer, the flattening acting to assist in improving process uniformities across the wafer.

3. The method of claim 1, wherein the method operation of flowing a process gas proximate to the bevel edge of the wafer to start processing of the bevel edge further includes,
    delivering the process gas through a single point of entry into the chamber.

4. The method of claim 1, wherein throttling the process pump down rate and the pumping down is controlled by a controller, while the controller further controls the flowing of the process gas to the periphery of the chamber proximate to the bevel edge, such that the pressure in the chamber is monitored and controlled during the processing.

5. The method of claim 1, further comprising:
    terminating plasma generation;
    closing valves used for the throttling of the process pump down rate;
    activating valves used for pumping down the chamber.

6. The method of claim 5, wherein valves used for the throttling are positioned in parallel to valves used for the pumping down of the chamber.

* * * * *